US008493794B2

United States Patent
Chang et al.

(10) Patent No.: US 8,493,794 B2
(45) Date of Patent: Jul. 23, 2013

(54) NON-VOLATILE MEMORY CELL AND METHODS FOR PROGRAMMING, ERASING AND READING THEREOF

(75) Inventors: Chia-Chuan Chang, Miaoli County (TW); Wei-Sung Chen, Hsinchu County (TW); Chung-Ho Wu, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 255 days.

(21) Appl. No.: 13/183,944

(22) Filed: Jul. 15, 2011

(65) Prior Publication Data

US 2013/0016568 A1    Jan. 17, 2013

(51) Int. Cl.
*G11C 11/34* (2006.01)
(52) U.S. Cl.
USPC .................................................... 365/185.26
(58) Field of Classification Search
USPC .................................................... 365/185.26
See application file for complete search history.

(56) References Cited

U.S. PATENT DOCUMENTS

| | | | |
|---|---|---|---|
| 6,125,051 A * | 9/2000 | Kang | 365/145 |
| 6,628,544 B2 * | 9/2003 | Shum et al. | 365/185.03 |
| 6,980,472 B2 * | 12/2005 | Ditewig et al. | 365/185.18 |
| 7,209,392 B2 * | 4/2007 | Chen et al. | 365/185.26 |
| 7,573,749 B2 * | 8/2009 | Diorio et al. | 365/185.21 |
| 7,700,993 B2 * | 4/2010 | Cai et al. | 257/315 |
| 8,228,726 B2 * | 7/2012 | Fang et al. | 365/185.01 |
| 2005/0269626 A1 * | 12/2005 | Forbes | 257/315 |
| 2006/0245233 A1 * | 11/2006 | Mikolajick et al. | 365/100 |
| 2008/0035973 A1 * | 2/2008 | Lin et al. | 257/298 |

* cited by examiner

*Primary Examiner* — Hoai V Ho
*Assistant Examiner* — Pablo Huerta
(74) *Attorney, Agent, or Firm* — Birch, Stewart, Kolasch & Birch, LLP

(57) ABSTRACT

A non-volatile memory cell and methods for programming, erasing and reading thereof are provided. A non-volatile memory cell includes a well region having a first conductive type. A first transistor and a second transistor having a second conductive type are disposed on the well region, wherein a first gate of the first transistor is coupled to a second gate of the second transistor. The first transistor and the second transistor share a drain region, coupling to a bit line. A first source region of the first transistor and a second region of the second transistor are coupled to a first select line and a second line, respectively. A bit is stored in the first and second gates by controlling the first select line and the second line. A bit stored in the first and second gates is erased by controlling the first select line or the second line.

12 Claims, 1 Drawing Sheet

NON-VOLATILE MEMORY CELL AND METHODS FOR PROGRAMMING, ERASING AND READING THEREOF

BACKGROUND OF THE INVENTION

1. Field of the Invention

The present invention relates to a non-volatile memory cell and methods for programming, erasing and reading thereof, and in particular, to a single gate electrically erasable programmable read-only memory (EEPROM) cell and methods for programming, erasing and reading thereof.

2. Description of the Related Art

The conventional single gate non-volatile memory cell is usually composed by a select transistor and a store transistor, which are coupled in series. Because data of the non-volatile memory cell is stored in a single store transistor, the operation efficiency (including programming speed and erasing speed) of the cell can not be improved. Additionally, the conventional single gate non-volatile memory cell has a small read current, resulting in a narrow margin of read currents occurring between a program state and an erase state of the cell. If the conventional single gate non-volatile memory cell is subjected to a finite number of programming/erasing operation cycles, a difference of the read currents in the program state and the erase state will be hard to distinguish. The reliability of the non-volatile memory cell will suffered from the aforementioned drawbacks.

Thus, a novel non-volatile memory cell and methods for programming, erasing and reading thereof are desired.

BRIEF SUMMARY OF INVENTION

A non-volatile memory cell and methods for programming, erasing and reading thereof are provided. An exemplary embodiment of a non-volatile memory cell, which is used to store a single bit of data, comprises a well region having a first conductive type. A first transistor and a second transistor having a second conductive type opposite to the first conductive type are disposed on the well region, wherein a first gate of the first transistor is coupled to a second gate of the second transistor, the first transistor and the second transistor share a drain region, coupling to a bit line, and a first source region of the first transistor and a second source region of the second transistor are coupled to a first select line and a second select line, respectively, wherein a bit is stored in the first and second gates by controlling the first select line and the second select line, and the bit stored in the first and second gates is erased by controlling the first select line and the second select line.

A method for programming a non-volatile memory cell, which is used to store a single bit of data, comprises providing a non-volatile memory cell comprising a well region having a first conductive type. A first transistor and a second transistor having a second conductive type opposite to the first conductive type are disposed on the well region, wherein a first gate of the first transistor is coupled to a second gate of the second transistor, the first transistor and the second transistor share a drain region, coupling to a bit line, and a first source region of the first transistor and a second source region of the second transistor are coupled to a first select line and a second select line, respectively, wherein a bit is stored in the first and second gates by controlling the first select line and the second select line, and the bit stored in the first and second gates is erased by controlling the first select line and the second select line. A first voltage is applied to the first select line. A second voltage is applied to the second select line. A third voltage is applied to the bit line and the well region, wherein the first and second voltages are larger than 0V and the third voltage is 0V.

A method for erasing a non-volatile memory cell, which is used to store a single bit of data, comprises providing a non-volatile memory cell comprising a well region having a first conductive type. A first transistor and a second transistor having a second conductive type opposite to the first conductive type are disposed on the well region, wherein a first gate of the first transistor is coupled to a second gate of the second transistor, the first transistor and the second transistor share a drain region, coupling to a bit line, and a first source region of the first transistor and a second source region of the second transistor are coupled to a first select line and a second select line, respectively, wherein a bit is stored in the first and second gates by controlling the first select line and the second select line, and the bit stored in the first and second gates is erased by controlling the first select line and the second select line. A first voltage is applied to the first select line. A second voltage is applied to the second select line. A third voltage is applied to the bit line and the well region, wherein the first voltage is larger than the second voltage, and the third voltage is 0V.

A method for reading a non-volatile memory cell, which is used to store a single bit of data, comprises providing a non-volatile memory cell comprising a well region having a first conductive type. A first transistor and a second transistor having a second conductive type opposite to the first conductive type are disposed on the well region, wherein a first gate of the first transistor is coupled to a second gate of the second transistor, the first transistor and the second transistor share a drain region, coupling to a bit line, and a first source region of the first transistor and a second source region of the second transistor are coupled to a first select line and a second select line, respectively, wherein a bit is stored in the first and second gates by controlling the first select line and the second select line, and the bit stored in the first and second gates is erased by controlling the first select line and the second select line. A first voltage is applied to the bit line. A second voltage is applied to the first select line, the second select line and the well region, wherein the first voltage is larger than 0V, and the second voltage is 0V.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
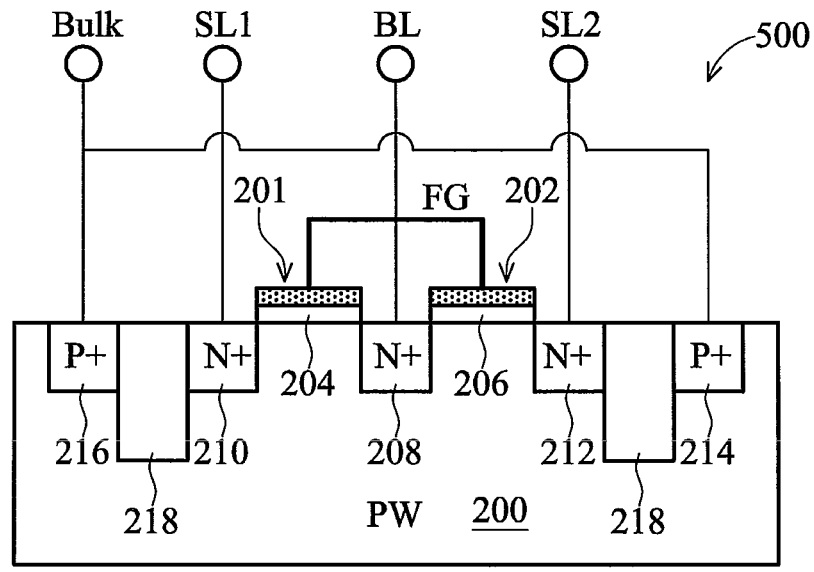
FIG. 1 is a cross section view showing one exemplary embodiment of a non-volatile memory cell of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Figure 2:
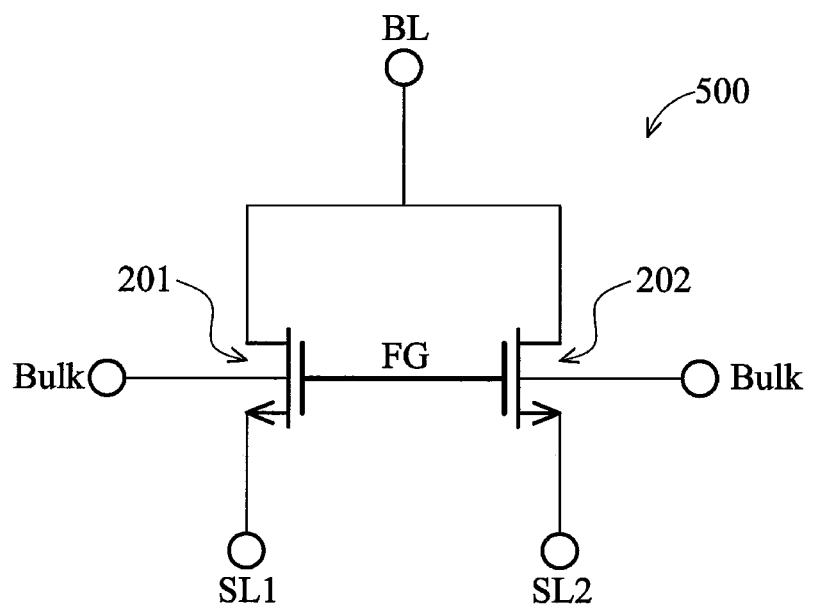
FIG. 2 is a circuit diagram showing one exemplary embodiment of a non-volatile memory cell of the invention.

FIG. 1 is a cross section view showing one exemplary embodiment of a non-volatile memory cell 500 of the invention. FIG. 2 is a circuit diagram showing one exemplary embodiment of a non-volatile memory cell 500 of the invention. One exemplary embodiment of a non-volatile memory cell 500 uses two transistors to compose a single gate electrically erasable programmable read-only memory (EEPROM) cell to store a single bit of data. Please refer to FIGS. 1 and 2, wherein one exemplary embodiment of a non-volatile memory cell 500 may comprise a well region 200 having a first conductive type. A first transistor 201 and a second transistor 202 having a second conductive type opposite to the first conductive type are disposed on the well region 200, respectively. The first transistor 201 and the second transistor 202 are four-terminal transistors, respectively. The four-terminal transistor has a gate terminal, a source terminal, a drain terminal and a bulk terminal. In one embodiment, the well region 200 is a p-well (PW) region. Also, the first transistor 201 and the second transistor 202 may both be n-type metal-oxide-semiconductor (NMOS) transistors. A gate 204 of the first transistor 201 and a gate 206 of the second transistor 202 are coupled to each other. That is to say, a gate terminal of the first transistor 201 is coupled to a gate terminal of the second transistor 202. In one embodiment, the gates 204 and 206 are single gate structures, and the gates 204 and 206 are electrically floating. Therefore, the coupling gates 204 and 206 may serve as a floating gate (FG) of the non-volatile memory cell 500. The first transistor 201 and the second transistor 202 share a drain region 208. Therefore, as shown in FIG. 1, the drain region 208 is disposed between the gate 204 of the first transistor 201 and the gate 206 of the second transistor 202. Also, the drain region 208 is coupled to a bit line BL. That is to say, a drain terminal of the first transistor 201 is coupled to a drain terminal of the second transistor 202 as show in FIG. 2, and the bit line may be coupled to a sense amplifier. A source region 210 of the first transistor 201 and a source region 212 of the second transistor 202 are disposed in the well region 200, respectively. The source region 210 and the drain region 208 are disposed adjacent two opposite sides of the gate 204 of the first transistor 201. The source region 212 and the drain region 208 are disposed adjacent two opposite sides of the gate 206 of the second transistor 202. The source region 210 of the first transistor 201 and the source region 212 of the second transistor 202 are coupled to a first select line SL1 and a second select line SL2, respectively. That is to say, a source terminal of the first transistor 201 is coupled to the first select line SL1 and a source terminal of the second transistor 202 is coupled to the second select line SL2. In one embodiment, the source regions 210 and 212 and the drain region 208 are n-type. A plurality of heavily doped n-type (N+) regions can be formed in the p-type well region 200 to serve as the source regions 210 and 212 and the drain region 208. Additionally, a plurality of heavily doped p-type (P+) regions can be formed in the p-type well region 200 to serve as bulk doped regions 214 and 216. The bulk doped regions 214 and 216 are respectively isolated from the adjacent source regions 201 and 212 by isolation structures 218 formed in the well region 200.

Next, operation methods of one exemplary embodiment of a non-volatile memory cell 500 of the invention will be described. Operation conditions of a single non-volatile memory cell 500 or a memory array arranged by a plurality of non-volatile memory cells 500 will be described in the following Tables 1 to 3. The arranging type of the memory array is that the drain regions 208 of the non-volatile memory cells 500 are coupled to the same bit line BL. In Tables 1 to 3, the state "select" means the operation conditions of the selected single non-volatile memory cell 500 or the selected non-volatile memory cells 500 of the memory array. The state "unselect" means the operation conditions of the non-volatile memory cells 500 of the memory array, exclusive of the selected non-volatile memory cells 500 of the memory array.

The operation method of one exemplary embodiment of a non-volatile memory cell 500 comprises a programming operation, an erasing operation and a reading operation. The programming operation of one exemplary embodiment of a non-volatile memory cell 500 uses channel hot electron (CHE) injection to inject electrons into the floating gate.

TABLE 1 the programming operation of one exemplary embodiment of a non-volatile memory cell 500

|  | VSL1 | | VSL2 | | | |
| --- | --- | --- | --- | --- | --- | --- |
|  | select | unselect | select | unselect | VBL | VBulk |
| applied voltage | HV | 0 V | HV | 0 V | 0 V | 0 V |

As shown in Table 1, the programming operation of the selected non-volatile memory cell 500 comprises applying a voltage VBulk of 0V to bulk terminals of the first transistor 201 and the second transistor 202 (i.e. the bulk doped regions 214 and 216 of the well region 200 such as p-well as shown in FIG. 2). The bit line BL is applied a voltage VBL of 0V. The first select line SL1 (i.e. the n-type source region 210 such as an N+ doped region as shown in FIG. 2) and the second select line SL2 (i.e. the n-type source region 212 such as an N+ doped region as shown in FIG. 2) are applied voltages VSL1 and VSL2 of a high enough voltage of HV. Therefore, a reverse biased pn junction is formed between the n-type source region 210, the n-type source region 212 and the p-type well region 200, and coupled to the floating gate (FG) (i.e. the gate 204 and 206 as shown in FIG. 2) through the n-type source region 210 and the n-type source region 212. Therefore, the floating gate (FG) is applied with a high voltage for a very short period of time, and the channel hot electrons (CHE) are simultaneously injected from the bit line (BL) into the floating gate (FG) after passing through channels of the first transistor 201 and the second transistor 202. A bit is stored in the floating gate (FG), completing the programming operation of the selected non-volatile memory cell 500. In one embodiment, the voltage VSL1 may be larger than 0V and smaller than the breakdown voltage of the n-type source region 210 to the p-type well region 200. The voltage VSL2 may be larger than 0V and smaller than the breakdown voltage of the n-type source region 212 to the p-type well region 200. Because the channel hot electrons (CHE) are accelerated to simultaneously be injected from the bit line (BL) into the floating gate (FG) after passing through channels of the first transistor 201 and the second transistor 202 during the programming operation, the non-volatile memory cell 500 has a faster programming speed and an increased number of program cycles.

The erasing operation of one exemplary embodiment of a non-volatile memory cell 500 uses band-to-band hot hole (BBHH) injection to inject hot holes into the floating gate.

TABLE 2 the erasing operation of one exemplary embodiment
of a non-volatile memory cell 500

|  | VSL1 | | VSL2 | | VBL | VBulk |
| --- | --- | --- | --- | --- | --- | --- |
|  | select | unselect | select | unselect |  |  |
| applied voltage | HV | 0 V | >0 V | 0 V | 0 V | 0 V |
| applied voltage | >0 V | 0 V | HV | 0 V | 0 V | 0 V |

As shown in Table 2, the erasing operation of the selected non-volatile memory cell 500 comprises applying a voltage VBulk of 0V to bulk terminals of the first transistor 201 and the second transistor 202 (i.e. the bulk doped regions 214 and 216 of the well region 200 such as p well as shown in FIG. 2). The bit line BL is applied a voltage VBL of 0V. The first select line SL1 (i.e. the n-type source region 210 such as an N+ doped region as shown in FIG. 2) is applied a voltage VSL1 of a high enough voltage of HV, thereby forming a reverse biased pn junction between the n-type source region 210 and the p-type well region 200. The second select line SL2 (i.e. the n-type source region 212 such as an N+ doped region as shown in FIG. 2) is applied a voltage VSL2 of larger than 0V to increase the probability of the hole fluctuation. Therefore, the hot holes (HH) generated by band-to-band hot hole (BBHH) are injected into the floating gate (FG) to erase the stored bit in the floating gate (FG), completing the erasing operation of the selected non-volatile memory cell 500. In one embodiment, the voltage VSL1 may be larger than 0V and smaller than the breakdown voltage of the n-type source region 210 to the p-type well region 200. The voltage VSL2 is smaller than the voltage VSL1, between about 1V and 2V. In one embodiment, the voltages VSL1 and VSL2 can be switched to increase the number of erasing cycles.

The reading operation of one exemplary embodiment of a non-volatile memory cell 500 is achieved by applying a small voltage to the bit line (BL) to measure currents flowing through the first select line SL1 and the second select line SL2.

TABLE 3 the reading operation of one exemplary embodiment
of a non-volatile memory cell 500

|  | VSL1 | VSL2 | VBL | | VBulk |
| --- | --- | --- | --- | --- | --- |
|  | select | select | select | unselect |  |
| applied voltage | 0 V | 0 V | >0 V | 0 V | 0 V |

As shown in Table 3, the reading operation of the selected non-volatile memory cell 500 comprises applying a voltage VBulk of 0V to bulk terminals of the first transistor 201 and the second transistor 202 (i.e. the bulk doped regions 214 and 216 of the well region 200 such as p well as shown in FIG. 2). The first select line SL1 (i.e. the n-type source region 210 such as an N+ doped region as shown in FIG. 2) and the second select line SL2 (i.e. the n-type source region 212 such as an N+ doped region as shown in FIG. 2) are applied voltages VSL1 and VSL2 of 0V. The bit line BL is applied a voltage VBL larger than 0V. A sense amplifier coupled to the bit line BL is used to measure the currents flowing through the first select line SL1 and the second select line SL2, completing the reading operation of the selected non-volatile memory cell 500. The voltage VBL used to read the selected non-volatile memory cell 500 may be slightly larger than threshold voltages of the first and second transistors 201 and 202 to turn on the first and second transistors 201 and 202. Because the currents flow through two transistors, the first and second transistors 201 and 202, are simultaneously measured during reading of the selected non-volatile memory cell 500, such that the non-volatile memory cell 500 has a larger read current than the conventional non-volatile memory cell. Also, the non-volatile memory cell 500 has a larger current margin between the program state and erase state than the conventional non-volatile memory cell.

One exemplary embodiment of a non-volatile memory cell 500 of the invention uses two n-type MOS (NMOS) transistors disposed on a p-type well to serve as a single gate non-volatile memory cell, thereby storing a single bit of data therein. The gates of the two NMOS transistors, which are coupled to each other, may serve as a floating gate (FG). The two NMOS transistors share a drain, which is coupled to a bit line (BL). Drains of the two NMOS transistors may be coupled to a first select line SL1 and a second select line SL2, respectively. Therefore, a bit can be stored in the floating gate (FG) by controlling the first select line SL1 and the second select line SL2 (i.e. applying voltages to the first select line SL1 and the second select line SL2, respectively), and the bit stored in the floating gate (FG) is erased by controlling the first select line SL1 and the second select line SL2. Compared with the conventional single gate non-volatile memory cell, the non-volatile memory cell 500 has a faster programming speed, an increased number of programming cycles, and an increased number of erasing cycles. Because the non-volatile memory cell 500 has two NMOS transistors, the non-volatile memory cell 500 has a larger read current than the conventional non-volatile memory cell, resulting in a bigger current difference between the program state and erase state. Therefore, the non-volatile memory cell 500 has a larger current margin between the program state and erase state than the conventional non-volatile memory cell. Additionally, the non-volatile memory cell 500 is formed only on a p-type well, thus, a standard logic process can be used to fabricate the non-volatile memory cell 500 without additional mask processes to form additional wells, which would be harmful to product yields.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory cell, which is used to store a single bit of data, comprising:
    a well region having a first conductive type; and
    a first transistor and a second transistor having a second conductive type opposite to the first conductive type disposed on the well region, wherein a first gate of the first transistor is coupled to a second gate of the second transistor, the first transistor and the second transistor share a drain region, coupling to a bit line, and a first source region of the first transistor and a second source region of the second transistor are coupled to a first select line and a second select line, respectively,
    wherein a bit is stored in the first and second gates by controlling the first select line and the second select line, and the bit stored in the first and second gates is erased by controlling the first select line and the second select line.

2. The non-volatile memory cell as claimed in claim 1, wherein the first conductive type is p type, and the second conductive type is n type.

3. The non-volatile memory cell as claimed in claim 2, wherein the drain region, the first source region and the second source region are n type.

4. The non-volatile memory cell as claimed in claim 1, wherein the first gate and the second gate are single gates.

5. The non-volatile memory cell as claimed in claim 1, wherein the bit line is coupled to a sense amplifier.

6. The non-volatile memory cell as claimed in claim 1, wherein the first gate and the second gate are electrical floating gates.

7. A method for programming a non-volatile memory cell, which is used to store a single bit of data, comprising:
   providing the non-volatile memory cell as claimed in claim 1;
   applying a first voltage to the first select line;
   applying a second voltage to the second select line; and
   applying a third voltage to the bit line and the well region, wherein the first and second voltages are larger than 0V and the third voltage is 0V.

8. The method for programming a non-volatile memory cell as claimed in claim 7, wherein the first and second voltages are respectively smaller than the breakdown voltages of the first and second source regions.

9. A method for erasing a non-volatile memory cell, which is used to store a single bit of data, comprising:
   providing the non-volatile memory cell as claimed in claim 1;
   applying a first voltage to the first select line;
   applying a second voltage to the second select line; and
   applying a third voltage to the bit line and the well region, wherein the first voltage is larger than the second voltage, and the third voltage is 0V.

10. The method for erasing a non-volatile memory cell as claimed in claim 9, wherein the first voltage is larger than 0V and smaller than a breakdown voltage of the first source region, and the second voltage is between 1V and 2V.

11. A method for reading a non-volatile memory cell, which is used to store a single bit of data, comprising:
   providing the non-volatile memory cell as claimed in claim 1;
   applying a first voltage to the bit line; and
   applying a second voltage to the first select line, the second select line and the well region, wherein the first voltage is larger than 0V, and the second voltage is 0V.

12. The method for reading a non-volatile memory cell as claimed in claim 11, wherein the first voltage is larger than threshold voltages of the first and second transistor.

* * * * *